United States Patent
Hine et al.

(10) Patent No.: US 10,636,724 B2
(45) Date of Patent: Apr. 28, 2020

(54) MOUNT STRUCTURE

(71) Applicant: Panasonic Intellectual Property Management Co., Ltd., Osaka (JP)

(72) Inventors: Kiyohiro Hine, Osaka (JP); Akio Furusawa, Osaka (JP); Hidetoshi Kitaura, Osaka (JP); Kazuki Sakai, Osaka (JP)

(73) Assignee: PANASONIC INTELLECTUAL PROPERTY MANAGEMENT CO., LTTD., Osaka (JP)

( * ) Notice: Subject to any disclaimer, the term of this patent is extended or adjusted under 35 U.S.C. 154(b) by 111 days.

(21) Appl. No.: 15/950,039

(22) Filed: Apr. 10, 2018

(65) Prior Publication Data

US 2018/0331013 A1 Nov. 15, 2018

(30) Foreign Application Priority Data

May 9, 2017 (JP) ................................ 2017-093271

(51) Int. Cl.
*H01L 23/373* (2006.01)
*H01L 23/498* (2006.01)
(Continued)

(52) U.S. Cl.
CPC ...... *H01L 23/3735* (2013.01); *B23K 35/3013* (2013.01); *B32B 9/005* (2013.01);
(Continued)

(58) Field of Classification Search
CPC ... H01L 23/3735; H01L 23/142; H01L 23/15; H01L 23/49811; H01L 23/49866;
(Continued)

(56) References Cited

U.S. PATENT DOCUMENTS 8,309,969 B2  11/2012  Suehiro et al.
8,559,475 B2  10/2013  Hammel et al.
(Continued)

FOREIGN PATENT DOCUMENTS

JP  2566341 B  12/1996
JP  2006278463 A * 10/2006 ............. H01L 24/29
(Continued)

OTHER PUBLICATIONS

Espacenet Translation of JP2006-278463 (Year: 2019).*
(Continued)

*Primary Examiner* — Michael Zhang
(74) *Attorney, Agent, or Firm* — Wenderoth, Lind & Ponack, L.L.P.

(57) ABSTRACT

A mount structure having a joining capable of withstanding development of cracks generated by thermal stress due to repeated temperature changes in a mount structure having the joining of a large area is formed by joining a ceramic substrate electrode of a ceramic substrate and a metal substrate electrode of a metal substrate by a laminate, in which the laminate is formed by stacking a first interface layer, a first solder joining portion, a second interface layer, a first buffer material electrode, a buffer material, a second buffer material electrode, a third interface layer, a second solder joining portion and a fourth interface layer in this order from the ceramic substrate electrode toward the metal substrate electrode, a thickness of the laminate is 30 μm or more and 100 μm or less, a difference between a thickness of the first solder joining portion and a thickness of the second solder joining portion is within 25%, and differences in elastic moduli and in linear expansion coefficients between the first solder joining portion and the buffer material are respectively within 62%.

9 Claims, 1 Drawing Sheet

(51) Int. Cl.
*H01L 23/15* (2006.01)
*H01L 23/14* (2006.01)
*H01L 33/62* (2010.01)
*H01L 33/64* (2010.01)
*H01L 21/48* (2006.01)
*B23K 35/30* (2006.01)
*B32B 9/00* (2006.01)
*B32B 15/20* (2006.01)
*C22C 5/02* (2006.01)
*H01L 23/00* (2006.01)
*B23K 101/36* (2006.01)
*B23K 103/12* (2006.01)
*B23K 103/00* (2006.01)

(52) U.S. Cl.
CPC ............... *B32B 15/20* (2013.01); *C22C 5/02* (2013.01); *H01L 21/4857* (2013.01); *H01L 21/4882* (2013.01); *H01L 23/142* (2013.01); *H01L 23/15* (2013.01); *H01L 23/49811* (2013.01); *H01L 23/49822* (2013.01); *H01L 23/49866* (2013.01); *H01L 24/26* (2013.01); *H01L 33/62* (2013.01); *H01L 33/641* (2013.01); *H01L 33/647* (2013.01); *B23K 2101/36* (2018.08); *B23K 2103/12* (2018.08); *B23K 2103/52* (2018.08); *B32B 2457/00* (2013.01); *H01L 2224/83101* (2013.01)

(58) Field of Classification Search
CPC . H01L 23/49822; H01L 24/26; H01L 33/647; H01L 33/641; H01L 33/62; H01L 21/4882; H01L 21/4857; H01L 2224/83101; C22C 5/02; B23K 35/3013; B23K 2103/52; B23K 2103/12; B23K 2101/36; B32B 15/20; B32B 9/005; B32B 2457/00

See application file for complete search history.

(56) References Cited

U.S. PATENT DOCUMENTS

| | | | |
|---|---|---|---|
| 2004/0013149 A1* | 1/2004 | Hanaoka | B82Y 20/00 372/46.01 |
| 2006/0124941 A1* | 6/2006 | Lee | H01L 33/0079 257/88 |
| 2010/0123164 A1 | 5/2010 | Suehiro et al. | |
| 2012/0061698 A1* | 3/2012 | Toscano | C23C 18/1651 257/88 |
| 2013/0089937 A1* | 4/2013 | Chern | H01L 33/62 438/28 |
| 2017/0018697 A1 | 1/2017 | Konishi et al. | |

FOREIGN PATENT DOCUMENTS

| | | |
|---|---|---|
| JP | 2010-258403 | 11/2010 |
| WO | 2008/002186 | 1/2008 |
| WO | 2015/151686 | 10/2015 |

OTHER PUBLICATIONS

Zhou, Tao, et al. "Au/Sn solder alloy and its applications in electronics packaging." Coining Inc (1999). (Year: 1999).*
Subramanian, R. "Strength of Materials," Oxford University Press: 2010 (Year: 2010).*
Hyperphysics—Thermal Expansion Coefficients at 20 C, https://web.archive.org/web/20001211145300/http://hyperphysics.phy-astr.gsu.edu/hbase/Tables/thexp.html (Year: 2000).*

* cited by examiner

MOUNT STRUCTURE

TECHNICAL FIELD

The technical field relates to a mount structure having a configuration in which two members are joined by a metal material used for devices such as an LED (Light Emitting Diode) and power devices.

BACKGROUND

In devices that generate heat such as in an LED, one such device has a mount structure in which two members, which are a substrate and a heat dissipation section, are joined for transporting heat from the substrate on which elements are mounted to the heat dissipation section for the purpose of dissipating generated heat.

In recent years, there is an increasing amount of heat generated by increasingly high output devices such as the LED. Accordingly, it is required to dissipate heat more efficiently. In order to dissipate heat efficiently, there is an increase in area of a joining portion between members of a mount structure. As a path for dissipating heat can be increased by increasing the area, larger output can be realized.

As a joining material for the joining portion of the mount structure, it is possible to use a solder material at a low temperature.

As the temperature is changed due to heat generation when the mount structure is operated, thermal stress and thermal strain are generated due to a difference in linear expansion coefficients between members at the time of temperature change in a case where materials of two members differ.

However, the thermal strain and the thermal stress are increased by the increase in area of the joining portion. Therefore, in a case where the temperature change occurs in the joining portion repeatedly, there is a problem of difficulty for a solder joining portion to withstand the changes and cracks occur. The occurrence of cracks causes a reduction in the heat dissipation property and a reduction in the joining strength. A mount structure which can withstand the development of cracks due to repeated temperature changes is required even when the joining portion with a large area exceeds 10 mm square.

Accordingly, as a related-art mount structure in which development of cracks hardly occurs, there is a mount structure in which a ceramic substrate has a metallized film, a metallic support that is connected to the metallized film through a stress relaxation material, a portion between the metallized film and the stress relaxation material is connected by a first joining material, a portion between the stress relaxation material and the metallic support is connected by a second joining material and the first joining material is thicker than the second joining material (for example, refer to Japanese Patent No. 2566341 (Patent Literature 1)).

However, in the mount structure described in Patent Literature 1, it is necessary to form the first joining material to be thicker than the second joining material, and the ceramic substrate tends to be inclined due to a difference of wettability between the first joining material and the second joining material at the time of mounting. This is a problem because the inclination of the ceramic substrate affects a radiation direction of light in devices such as the LED. Moreover, stress concentration occurs in the first and second joining materials when mechanical properties between the stress relaxation material and the first/second joining materials differ. Therefore, cracks easily occur, and crack formation is more prominent when the joining portion is increased in area. In particular, it is difficult to suppress development of cracks in first and second joining portions by using a Sn—Pb based solder with low bearing strength in the mount structure as described in Patent Literature 1.

SUMMARY

In view of the related-art problems, the present disclosure concerns a mount structure capable of withstanding large thermal stress even in the joining of a large area as well as withstanding the development of cracks due to repeated temperature changes.

Amount structure according to the present disclosure is amount structure in which a ceramic substrate electrode of a ceramic substrate and a metal substrate electrode of a metal substrate are joined by a laminate, in which the laminate is formed by stacking a first interface layer, a first solder joining portion, a second interface layer, a first buffer material electrode, a buffer material, a second buffer material electrode, a third interface layer, a second solder joining portion and a fourth interface layer in this order from the ceramic substrate electrode toward the metal substrate electrode, a thickness of the laminate is 30 μm or more and 100 μm or less, a difference between a thickness of the first solder joining portion and a thickness of the second solder joining portion is within 25%, and a difference in elastic moduli between the first solder joining portion and the buffer material and a difference in linear expansion coefficients between the first solder joining portion and the buffer material are respectively within 62%.

As the thicknesses of the first and second solder joining portions are equivalent in the mount structure according to the present disclosure, there is little difference in wetting forces (wettabilities) between both portions, and the ceramic substrate can be joined without inclination. Furthermore, differences in elastic moduli and linear expansion coefficients between the first and second solder joining portions and the buffer material are small. Therefore, stress concentration does not occur. Also, solder joining portions formed of strong Au-20Sn can improve thermal fatigue resistance even in a severe temperature environment.

DESCRIPTION OF EMBODIMENTS

Figure 1:
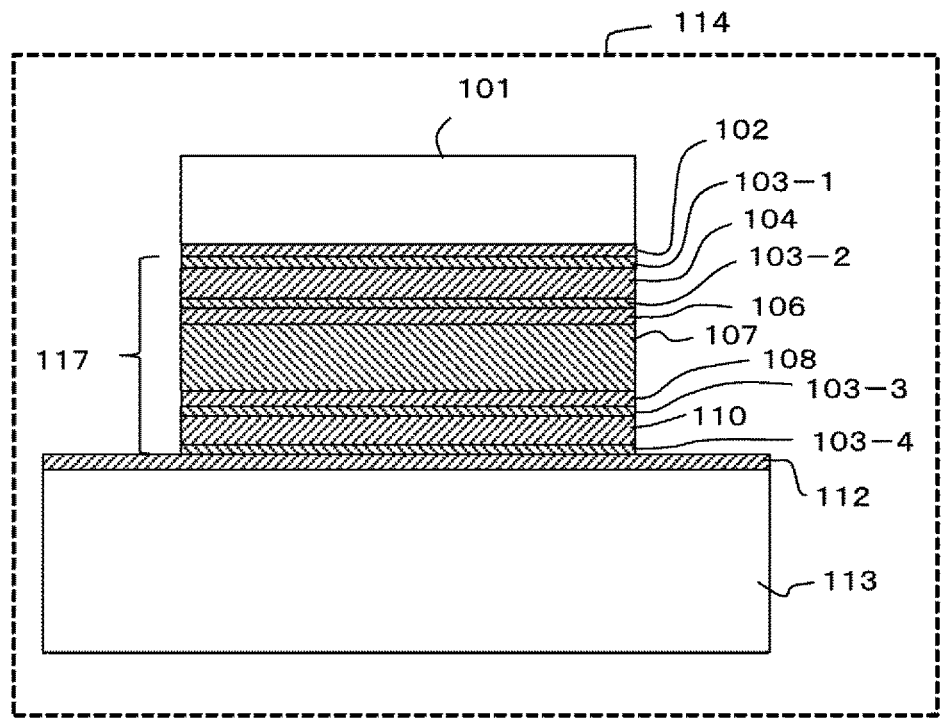
FIG. 1 is a cross-sectional view showing a first solder joining portion to a second solder joining portion in parallel with respect to a thickness direction in a mount structure according to Embodiment 1.

A mount structure according to an aspect of the present disclosure is formed by joining a ceramic substrate electrode of a ceramic substrate and a metal substrate electrode of a metal substrate by a laminate, in which the laminate is formed by stacking a first interface layer, a first solder joining portion, a second interface layer, a first buffer material electrode, a buffer material, a second buffer material electrode, a third interface layer, a second solder joining portion and a fourth interface layer in this order from the ceramic substrate electrode toward the metal substrate electrode, a thickness of the laminate is 30 μm or more and 100 μm or less, a difference between a thickness of the first solder joining portion and a thickness of the second solder joining portion is within 25%, and a difference in elastic moduli between the first solder joining portion and the buffer material and a difference in linear expansion coefficients between the first solder joining portion and the buffer material are respectively within 62%.

In the mount structure according to another aspect of the present disclosure, the difference in elastic moduli between the first solder joining portion and the buffer material and a difference in linear expansion coefficients between the first solder joining portion and the buffer material may be respectively within 20%.

In the mount structure according to further another aspect of the present disclosure, the first solder joining portion and the second solder joining portion may be formed of Au-20Sn.

In the mount structure according to further another aspect of the present disclosure, the buffer material may be formed of any of Cu, Al and Ag.

In the mount structure according to further another aspect of the present disclosure, the ceramic substrate may be formed of AlN.

In the mount structure according to further another aspect of the present disclosure, the metal substrate may be formed of Cu.

Hereinafter, amount structure according to embodiments of the present disclosure will be explained with reference to the attached drawings. The same numerals are added to members which are substantially the same in the drawings.

Embodiment 1

FIG. 1 is a cross-sectional view showing a first solder joining portion 104 to a second solder joining portion 110 in parallel with respect to a thickness direction in a mount structure 114 according to Embodiment 1.

The mount structure 114 according to Embodiment 1 is a mount structure in which a ceramic substrate electrode 102 of a ceramic substrate 101 and a metal substrate electrode 112 of a metal substrate 113 are joined by a laminate 117. The laminate 117 is formed by stacking a first interface layer 103-1, the first solder joining portion 104, a second interface layer 103-2, a first buffer material electrode 106, a buffer material 107, a second buffer material electrode 108, a third interface layer 103-3, the second solder joining portion 110 and a fourth interface layer 103-4 in this order from the ceramic substrate electrode 102 toward the metal substrate electrode 112. A thickness of the laminate 117 is 30 μm or more and 100 μm or less. Moreover, a difference between a thickness of the first solder joining portion 104 and a thickness of the second solder joining portion 110 is within 25%. Furthermore, a difference in elastic moduli between the first solder joining portion 104 and the buffer material 107 and a difference in linear expansion coefficients between the first solder joining portion 104 and the buffer material 107 are respectively within 62%.

The first and second solder joining portions 104 and 110 are formed of, for example, Au-20Sn (an AuSn alloy with a composition of 20 wt % Sn), in which an elastic modulus is 68 GPa and a linear expansion coefficient is 16 ppm/K.

The first and second solder joining portions 104 and 110 are formed to have approximately the same thickness.

When the ceramic substrate electrode 102 and the metal substrate electrode 112 are joined by the laminate 117, thicknesses of the first and second solder joining portions 104 and 110 are equivalent, wetting forces (wettabilities) are equivalent in the ceramic substrate electrode 102 and the metal substrate electrode 112. Accordingly, the wetting force in the horizontal direction is not biased, and it is possible to suppress inclination of the ceramic substrate 101 which is a problem when mounting an LED device.

When repeated temperature changes occur by operation of a device such as an LED, thermal stress is generated due to a difference in linear expansion coefficients between the ceramic substrate 101 and the metal substrate 113. The generated thermal stress is respectively applied to the first and second solder joining portions 104, 110 and the buffer material 107, which causes distortion. The thermal stress generated at the time of distortion is affected by respective elastic moduli and linear expansion coefficients. When respective elastic moduli and linear expansion coefficients differ, respective distortion behaviors also differ, therefore, stress concentration occurs.

Au-20Sn is a strong solder material and can withstand large thermal stress in the joining of a large area, however, it is difficult to suppress development of cracks when stress concentration occurs.

On the other hand, elastic moduli and linear expansion coefficients of the first and second solder joining portions 104, 110 and the buffer material 107 are close to one another in the mount structure according to Embodiment 1. Accordingly, it is possible to suppress stress concentration to thereby allow the mount structure to withstand large thermal stress in the case where the temperature change is large.

Consequently, a mount structure capable of withstanding development of cracks even in the joining of a large area can be obtained by the mount structure according to Embodiment 1.

In the case where the mount structure is used for devices such as an LED, the thickness of devices is increased when the thickness of the mount structure is large. The thickness between the first solder joining portion 104 to the second solder joining portion 110 is preferably within a range of 30 to 100 μm.

Members forming the mount structure will be explained below.

<Ceramic Substrate>

The ceramic substrate 101 may be, for example, an AlN substrate. Specifically, an AlN chip of 10 mm square or 15 mm square can be used.

<Ceramic Substrate Electrode>

The ceramic substrate electrode 102 is provided on the ceramic substrate 101, which may be, for example, a plating layer. The ceramic substrate electrode 102 may also be a two-layer plating layer including a Ni-plating as a lower layer and an Au-plating as an upper layer.

<Metal Substrate>

The metal substrate 113 may be, for example, a Cu plate.

<Metal Substrate Electrode>

The metal substrate electrode 112 is provided on the metal substrate 113, which may be, for example, a plating layer. The metal substrate electrode 112 may also be a two-layer plating layer including a Ni-plating as a lower layer and an Au-plating as an upper layer.

<Laminate>

The metal structure 114 is formed by joining the ceramic substrate electrode 102 of the ceramic substrate 101 and the metal substrate electrode 112 of the metal substrate 113 by the laminate 117. The laminate 117 is formed by stacking the first interface layer 103-1, the first solder joining portion 104, the second interface layer 103-2, the first buffer material electrode 106, the buffer material 107, the second buffer material electrode 108, the third interface layer 103-3, the second solder joining portion 110 and the fourth interface layer 103-4 in this order from the ceramic substrate electrode 102 toward the metal substrate electrode 112. A thickness of the laminate 117 is 30 μm or more and 100 μm or less. Respective layers included in the laminate 117 will be explained below.

<First Solder Joining Portion>

The first solder joining portion 104 may be a plating layer. A material for the layer may be, for example, Au-20Sn (an AuSn alloy with a composition of 20 wt % Sn) plating. The material is not limited to Au-20Sn. The thickness of the first solder joining portion 104 can be 1 μm or more and 10 μm or less.

The first interface layer 103-1 is formed as an interface layer between the ceramic substrate electrode 102 and the first solder joining portion 104. For example, in an interface between the Au plating as the upper layer of the ceramic substrate electrode 102 and the Au-20Sn plating of the first solder joining portion 104, the first interface layer 103-1 which is richer in Au than Au-20Sn is formed.

<Buffer Material>

As the buffer material 107, for example, Cu, Ag and Al can be used. Moreover, Cu foil, Ag foil and Al foil may be used. The Cu foil may have, for example, an elastic modulus of 75 GPa, a linear expansion coefficient of 16.2 ppm/K and a thickness of 35 μm. The first buffer material electrode 106 and the second buffer material electrode 108 may be plating layers, for example, Ni plating, which are applied to both surfaces of the Cu foil as the buffer material 107. A difference in elastic moduli between the first solder joining portion 104 and the buffer material 107 can be within 62%. Furthermore, a difference in linear expansion coefficients between the first solder joining portion 104 and the buffer material 107 can be within 62%.

The second interface layer 103-2 is formed as an interface layer between the first solder joining portion 104 and the first buffer material electrode 106. For example, in an interface between the Au-20Sn plating of the first solder joining portion 104 and the Ni plating of the first buffer material electrode 106, the second interface layer 103-2 containing three components of Au—Sn—Ni is formed.

<Second Solder Joining Portion>

The second solder joining portion 110 may be a plating layer. A material may be, for example, Au-20Sn (an AuSn alloy with a composition of 20 wt % Sn). The material is not limited to Au-20Sn. A thickness of the second solder joining portion 110 can be 1 μm or more and 10 μm or less. A difference between the thickness of the first solder joining portion 104 and the thickness of the second solder joining portion 110 can be within 25%.

The third interface layer 103-3 is formed as an interface layer between the second buffer material electrode 108 and the second solder joining portion 110. For example, in an interface between the Ni plating of the second buffer material electrode 108 and the Au-20Sn plating of the second solder joining portion 110, the third interface layer 103-3 containing three components of Au—Sn—Ni is formed.

The fourth interface layer 103-4 is formed as an interface layer between the second solder joining portion 110 and the metal substrate electrode 112.

(Manufacturing Method of Mount Structure)

The mount structure according to Embodiment 1 will be fabricated by the following procedure.

Figure 2:
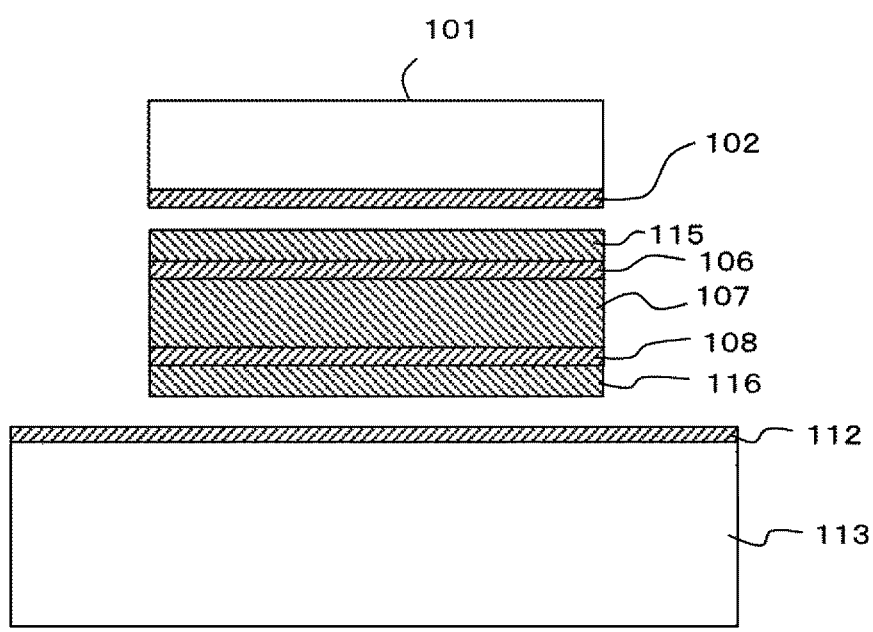
FIG. 2 is a cross-sectional view showing a first solder to a second solder in parallel with respect to a thickness direction before the mount structure according to Embodiment 1 is joined.

FIG. 2 is a cross-sectional view showing a first solder 115 to a second solder 116 in parallel with respect to a thickness direction before the mount structure according to Embodiment 1 is joined.

(1) The ceramic substrate 101 and the metal substrate 113 are prepared. The ceramic substrate electrode 102 is provided on one side of the ceramic substrate 101. The metal substrate electrode 112 is provided on one side of the metal substrate 113.

(2) The buffer material 107 is prepared. The first buffer material electrode 106 and the second buffer material electrode 108 are provided on both surfaces of the buffer material 107, and further, the first and second solders 115 and 116 are respectively provided on the surfaces thereof. The first and second solders 115 and 116 are fabricated by, for example, plating, a material of which is Au-20Sn plating and a thickness of which is 1 μm or more and 10 μm or less. The Cu foil to which Ni-plating is applied is prepared as the first and second buffer material electrodes 106 and 108 under these layers. The Cu foil portion will be the buffer material 107 after joining. Thicknesses of the first and second buffer material electrodes 106 and 108 are equivalent to each other and, for example, 1 μm or more and 3 μm or less. The Cu foil having an elastic modulus of 75 GPa, a linear expansion coefficient of 16.2 ppm/K and a thickness of 35 μm is used in Embodiment 1.

(3) Next, the ceramic substrate 101 and the buffer material 107 are installed so that the ceramic substrate electrode 102 faces the surface of the first solder 115. Then, the buffer material 107 and the metal substrate 113 are installed so that the metal substrate electrode 112 faces the second solder 116.

(4) Subsequently, these components are heated to 310° C. which is higher than 280° C. as a melting point of Au-20Sn of the first and second solders 115 and 116 in the above state to melt the first and second solders 115 and 116. Accordingly, the ceramic substrate electrode 102 and the first buffer material electrode 106 are joined through the first interface layer 103-1 and the second interface layer 103-2 on respective surfaces thereof. Also, the metal substrate electrode 112 on the metal substrate 113 and the second buffer material electrode 108 are joined through the third interface layer 103-3 and the fourth interface layer 103-4 on respective surfaces thereof. The mount structure 114 is formed by cooling the entire structure.

EXAMPLES AND COMPARATIVE EXAMPLES

Mount structures fabricated and evaluated in Examples 1 to 3 and Comparative Examples 1 to 4 are shown in Table 1. In Examples 1 to 3 and Comparative Examples 1 to 4, the thickness of Au-20Sn was changed and effects on the thicknesses of the first and second solder joining portions 104 and 110 were evaluated.

In Examples 1 to 3 and Comparative Examples 1 to 4, mount structures having large areas of 10 mm square and 15 mm square to join were fabricated and verified. Here, the ceramic substrate 101 is an AlN chip with 10 mm square or 15 mm square. The ceramic substrate electrode 102 has Au plating on the outermost layer and Ni-plating under the outermost layer on a back surface of the ceramic substrate. The metal substrate 113 is a Cu plate, which has the metal substrate electrode 112 having Au plating on the outermost layer and Ni-plating under the outermost layer on a back surface thereof.

<Check of Inclination State>

Initial states of inclination in the fabricated mount structures were checked by using a measuring microscope. States in which inclination is 10 μm or less is determined as "good", and states in which inclination is larger than the above is determined as "poor".

<Temperature Cycle Test>

After the initial states were checked, repeated temperature cycle tests were performed. Liquid-tank type temperature cycle tests were performed at −40° C. to 125° C. for 1000 cycles while holding 5 minutes respectively, and observation of cracks was performed by a scanning acoustic tomograph (SAT) after completing the tests. Observation results were also shown in Table 1, and whether the joining after development of cracks was secured or not was determined by the following criteria. That is, an area ratio of cracks was ⅓ or less of the entire area in both sizes of 10 mm square and 15 mm square in the ceramic substrates 101 was determined as "excellent", the area ratio of cracks was higher than ⅓ of the entire area in any of sizes of 10 mm square and 15 mm square and ½ or less was determined as "good" and the area ratio of cracks was higher than ½ of the entire area was determined as "poor".

TABLE 1

| | Thickness of first solder joining potion (μm) | Thickness of second solder joining portion (μm) | inclination | Development of cracks |
|---|---|---|---|---|
| Example 1-1 | 1 | 1 | good | excellent |
| Example 1-2 | 5 | 5 | good | excellent |
| Example 1-3 | 10 | 10 | good | excellent |
| Comparative Example 1-1 | 1 | 5 | poor | excellent |
| Comparative Example 1-2 | 1 | 10 | poor | excellent |
| Comparative Example 1-3 | 5 | 1 | poor | excellent |
| Comparative Example 1-4 | 10 | 1 | poor | excellent |

Referring to Table 1, initial inclinations are small and determined as "good" in all Examples 1-1 to 1-3. However, initial inclinations are large and determined as "poor" in Comparative Examples 1-1 to 1-4. Furthermore, wetting spreading states of solder at the time of melting are not uniform and inclinations are large in Comparative Examples 1-1 to 1-4.

Development of cracks is small and determined as "excellent" in all Examples 1-1 to 1-3 as well as in Comparative Examples 1-1 to 1-4.

Accordingly, when comparing Examples 1-1 to 1-3 with Comparative Examples 1-1 to 1-4, it can be found that the thickness of the first solder joining portion 104 and the thickness of the second solder joining portion 110 are preferably equivalent as a preferable condition for producing effects of the mount structure according to the present disclosure.

Examples 2-1 to 2-8, Comparative Examples 2-1 to 2-2

In Examples 2-1 to 2-8 and Comparative Examples 2-1 to 2-2, evaluations were performed by changing the material of the buffer material 107 for evaluating effects of physical properties of the buffer material 107.

Evaluation levels in Examples 2-1 to 2-8 and Comparative Examples 2-1 to 2-2 are shown in Table 2. Thicknesses of the first and second solder joining portions 104 and 110 are respectively 5 μm and the fabrication method and the evaluation method of the mount structures are the same as those in Example 1.

TABLE 2

| | Buffer material | | | | | |
|---|---|---|---|---|---|---|
| | Material | Thickness (μm) | Elastic modulus (GPa) | Linear expansion coefficient (ppm/K) | Inclination | Crack development |
| Example 2-1 | Cu | 35 | 75 | 16.2 | good | excellent |
| Example 2-2 | Cu | 70 | 75 | 16.2 | good | excellent |
| Example 2-3 | Cu | 35 | 110 | 16.2 | good | good |
| Example 2-4 | Cu | 70 | 110 | 16.2 | good | good |
| Example 2-5 | Ag | 35 | 76 | 19.3 | good | excellent |
| Example 2-6 | Ag | 70 | 76 | 19.3 | good | excellent |
| Example 2-7 | Al | 35 | 68.3 | 23.7 | good | good |
| Example 2-8 | Al | 70 | 68.3 | 23.7 | good | good |
| Comparative Example 2-1 | Ni | 35 | 207 | 15 | good | poor |
| Comparative Example 2-2 | Ni | 70 | 207 | 15 | good | poor |

Referring to Table 2, initial inclinations are small and determined as "good" in all Examples 2-1 to 2-3 as well as Comparative Examples 2-1 and 2-2. Accordingly, it can be found that the material of the buffer material 107 does not affect the initial inclination.

The development of cracks after performing repeated temperature cycle tests is small in Examples 2-1 to 2-8 and determined as "excellent" or "good". In particular, the development of crack is extremely small in Examples 2-1, 2-2 using Cu with low elasticity and in Examples 2-5, 2-6 using Ag as the buffer material 107, which are determined as "excellent".

On the other hand, the development of cracks is relatively large in Comparative Examples 2-1 and 2-2 using Ni as the buffer material 107 and determined as "poor".

Cu foil used as the buffer material 107 in Examples 2-1 and 2-2 has a low elastic modulus, and a difference as a comparison with 68 GPa as an elastic modulus of Au-20Sn is 10%. The linear expansion coefficients are extremely similar and a difference is 1%. Differences in elastic moduli and linear expansion coefficients between Ag foil used as the buffer material 107 in Examples 2-5 and 2-6 and Au-20Sn are respectively 3% and 20%.

This is because stress concentration does not occur and the joining of the Au-20Sn solder with high strength can be maintained as the elastic modulus and the linear expansion coefficient of the buffer material 107 are close to those of the first and second solder joining portions 104 and 110.

Differences in elastic moduli and the linear expansion coefficients between materials used as the buffer material 107 in other examples and comparative examples and the Au-20Sn solder used as the first and second solder joining portions 104 and 110 are as follows. Differences in elastic moduli and linear expansion coefficients between the Cu foil used as the buffer material 107 in Examples 2-3 and 2-4 and the Au-20Sn solder used as the first and second solder joining portions 104 and 110 are respectively 63% and 3%. Differences in elastic moduli and linear expansion coefficients between the Al foil used as the buffer material 107 in Examples 2-7 and 2-8 and the Au-20Sn solder used as the first and second solder joining portions 104 and 110 are respectively lower than 1% and 48%. Differences in elastic moduli and the linear expansion coefficients between the Ni foil used as the buffer material 107 in Comparative Examples 2-1 and 2-2 and the Au-20Sn solder used as the first and second solder joining portions 104 and 110 are respectively 204% and 6%.

According to the results of the examples and the comparative examples, the difference in elastic moduli and the linear expansion coefficients between the first and second solder joining portions 104, 110 and the buffer material 107 are preferably within 62% as a preferable condition for producing effects of the mount structure according to the present disclosure. As a particularly preferable condition, it is preferable that the difference in elastic moduli and linear expansion coefficients between the first and second solder joining portions 104, 110 and the buffer material 107 are within 20%.

The present disclosure includes suitable combinations of arbitrary embodiments and/or examples in the above various embodiments and/or examples, and advantages possessed by respective embodiments and/or examples can be obtained.

The mount structure according to the present disclosure has a joining which can withstand development of cracks generated by thermal stress due to repeated temperature changes. Accordingly, it is possible to provide a mount structure without inclination and excellent in the heat dissipation property for the joining of a large area in devices generating large heat such as an LED or power devices, which may contribute to improvement of performance in devices.

What is claimed is:

1. A mount structure comprising
a ceramic substrate electrode comprising a ceramic substrate, and a metal substrate electrode comprising a metal substrate, wherein the ceramic substrate electrode and the metal substrate electrode are joined by a laminate,
wherein the laminate is formed by stacking a first interface layer, a first solder joining portion, a second interface layer, a first buffer material electrode, a buffer material, a second buffer material electrode, a third interface layer, a second solder joining portion and a fourth interface layer in this order from the ceramic substrate electrode toward the metal substrate electrode,
wherein a thickness of the laminate is 30 μm or more and 100 μm or less,
wherein a difference between a thickness of the first solder joining portion and a thickness of the second solder joining portion is within 25%,
wherein a difference in elastic moduli between the first solder joining portion and the buffer material is within 10%, and
wherein a difference in linear expansion coefficients between the first solder joining portion and the buffer material is within 1%.

2. The mount structure according to claim 1, wherein the first solder joining portion and the second solder joining portion are formed of Au-20Sn.

3. The mount structure according to claim 1, wherein the buffer material is formed of Cu.

4. The mount structure according to claim 1, wherein the ceramic substrate is formed of AlN.

5. The mount structure according to claim 1, wherein the metal substrate is formed of Cu.

6. The mount structure according to claim 1, wherein the ceramic substrate electrode is a two-layer plating layer.

7. The mount structure according to claim 1, wherein the metal substrate electrode is a two-layer plating layer.

8. The mount structure according to claim 1, wherein the first buffer material electrode and the second buffer material electrode are plating layers.

9. The mount structure according to claim 1, wherein the second solder joining portion is a plating layer.

* * * * *